United States Patent
Manapat et al.

(10) Patent No.: US 6,327,175 B1
(45) Date of Patent: Dec. 4, 2001

(54) METHOD AND APPARATUS FOR CONTROLLING A MEMORY ARRAY WITH A PROGRAMMABLE REGISTER

(75) Inventors: Rajesh Manapat, Mountain View; Sunil Kumar Koduru, Sunnyvale, both of CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/395,057

(22) Filed: Sep. 13, 1999

(51) Int. Cl.[7] .................................................. G11C 11/00
(52) U.S. Cl. ................... 365/154; 365/233; 365/230.08; 365/230.09
(58) Field of Search ................................. 365/154, 233, 365/230.08, 230.09

(56) References Cited

U.S. PATENT DOCUMENTS

| | | | |
|---|---|---|---|
| 5,386,385 | * 1/1995 | Stephens, Jr. | 365/189.05 |
| 5,617,555 | * 4/1997 | Patel et al. | 395/432 |
| 5,634,139 | * 5/1997 | Takita | 395/855 |
| 5,793,693 | * 8/1998 | Collins et al. | 365/230.01 |
| 5,923,615 | * 7/1999 | Leach et al. | 365/238.5 |
| 5,953,285 | * 9/1999 | Churchill et al. | 365/233 |
| 6,026,465 | * 2/2000 | Mills et al. | 711/103 |
| 6,088,760 | * 7/2000 | Walker et al. | 711/104 |

* cited by examiner

*Primary Examiner*—David Nelms
*Assistant Examiner*—Connie C. Yoha
(74) *Attorney, Agent, or Firm*—Wagner, Murabito & Hao LLP

(57) ABSTRACT

A memory device (e.g., an SRAM) is configurable to be operated in an asynchronous or a synchronous mode in accordance with a value stored in a control register thereof. In addition to asynchronous and synchronous operating modes, additional features such burst mode operations, including asynchronous burst mode operations and/or synchronous burst mode operations (e.g., linear sequential and/or interleaved burst operations); the number of pipeline stages of an output path of the SRAM; and/or the number of data hold cycles for synchronous operation of the SRAM are configurable in accordance with additional values stored in the control register.

14 Claims, 15 Drawing Sheets

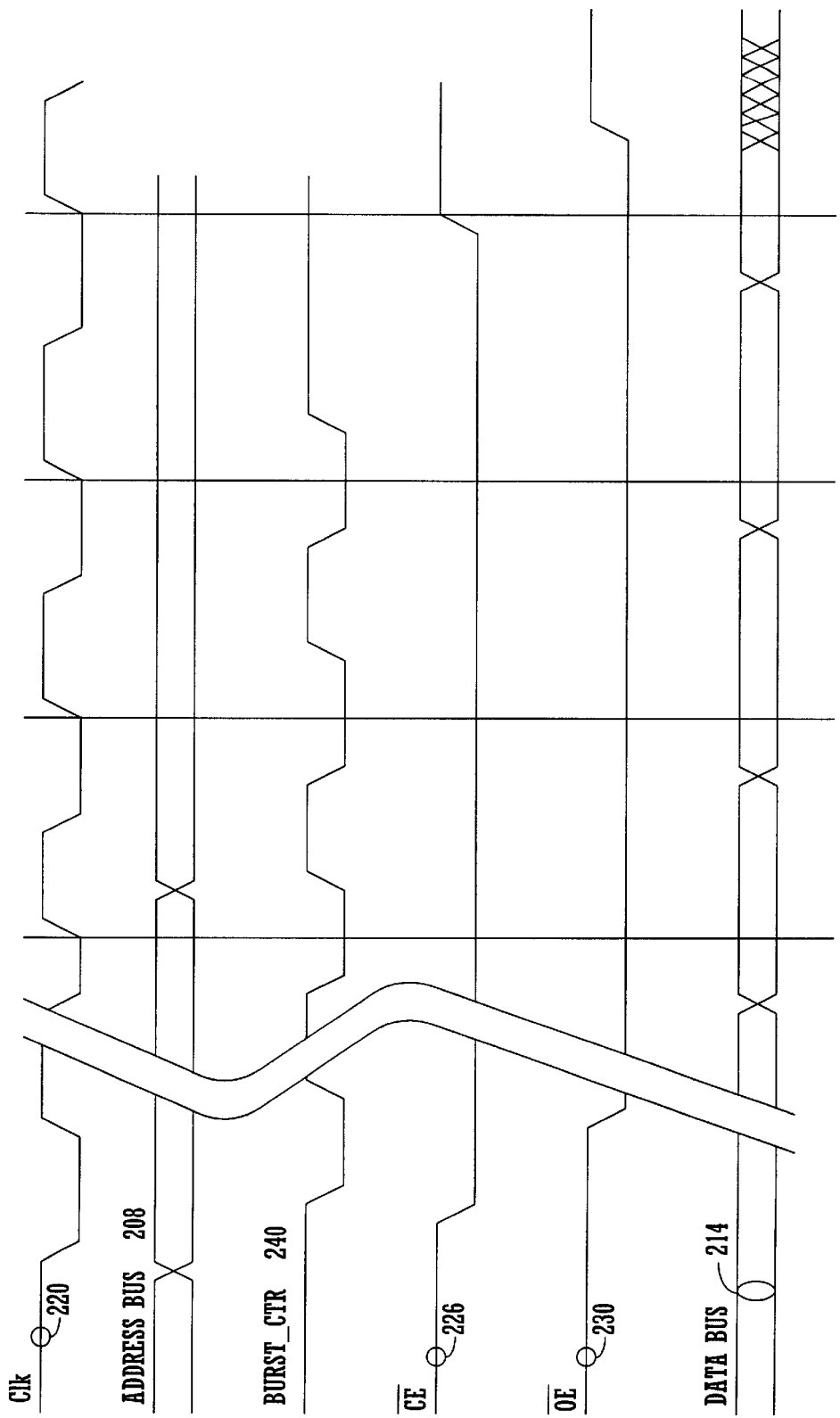

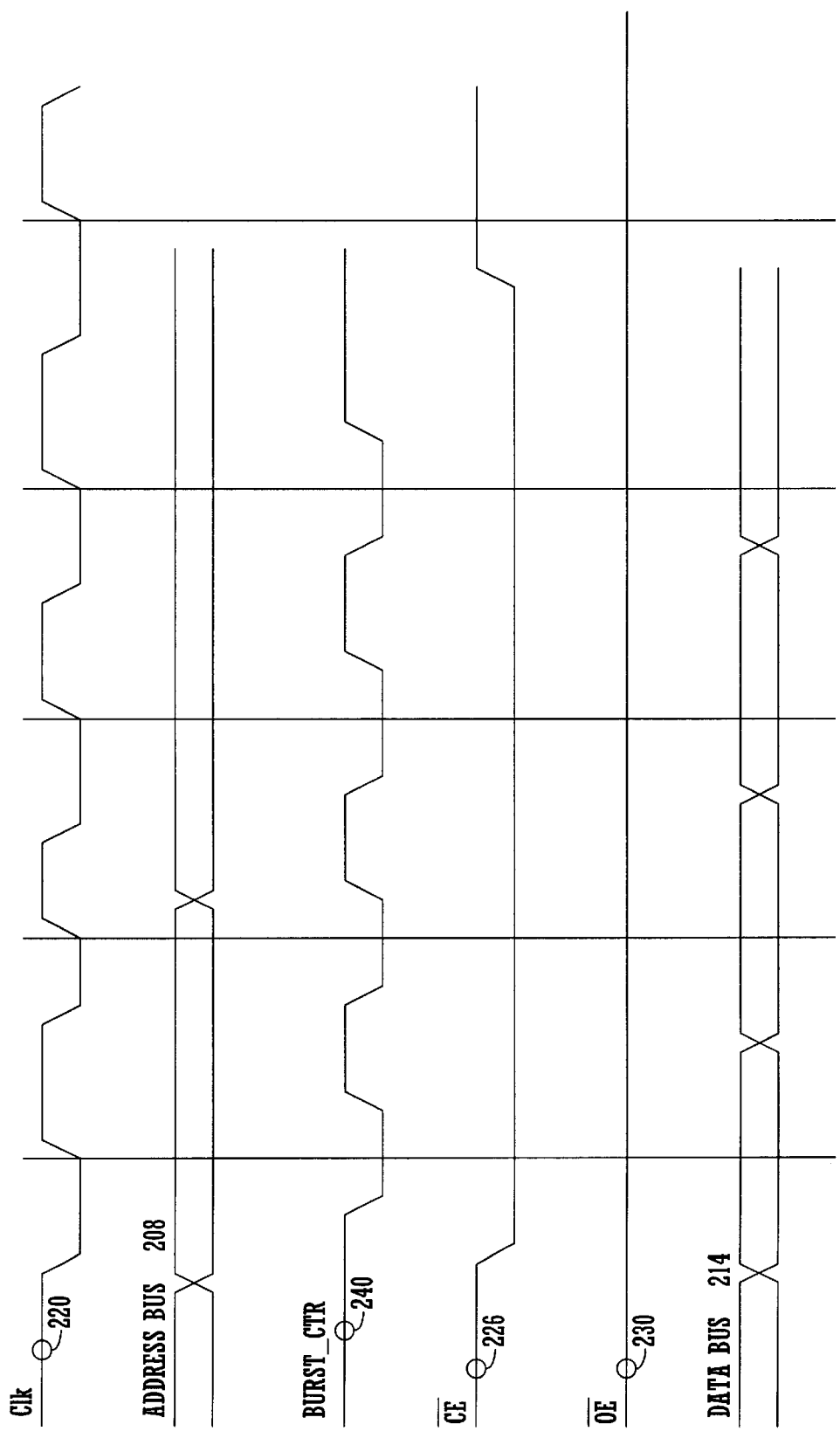

US 6,327,175 B1

METHOD AND APPARATUS FOR CONTROLLING A MEMORY ARRAY WITH A PROGRAMMABLE REGISTER

FIELD OF THE INVENTION

The present invention relates to the field of semiconductor memory devices and, in particular, to a memory device that combines the features of a synchronous and an asynchronous static random access memory (SRAM) in a single integrated circuit.

BACKGROUND

For over a decade, SRAMs have been used in a variety of applications, especially low power applications and small system applications where the higher cost of such devices (e.g., as compared to DRAMs) is offset by simpler and less expensive system design. To date however, system designers have been forced to choose between using asynchronous SRAMs and synchronous SRAMs. Thus, circuit board layouts (e.g., pin out patterns) have been unique for synchronous SRAMs and asynchronous SRAMs.

FIG. 1 illustrates the main features of a synchronous SRAM 10. As shown, various inputs to the device are provided to associated input registers, which operate under the control of a common clock signal (e.g., a system clock signal provided to other components in the system within which the memory is located) and/or a control signal (not shown). For example, signals from an address bus 12 are usually latched in address registers 14. Likewise, data signals from a data bus 16 are latched in data registers 18. Some synchronous SRAMs also latch a read/write control signal 20 in a write enable register 22. Usually, the input registers 14, 18 and 22 operate under the control of an internal clock signal 24, provided by clock input circuitry 26, which receives the system clock (Clk) 28.

Address signals 30 from the address registers 14 are usually provided to row decoders 32 and column decoders 34. Often, the column decoders are associated with input/output (I/O) circuitry (e.g., sense amplifiers and associated drivers) to access memory cells in the memory array 36. During a write, data signals 38 from the data registers 18 are provided to the column I/O circuits 34 through buffers 40 that are operated under the control of an internal write pulse 42. The internal write pulse 42 is usually generated by a combination of internal signals, for example the internal clock signal 24 and an internal write signal 44 from the write enable register 22. For a read, data signals 46 are provided from the I/O circuits 34 to output registers and buffers 48 that operate under the control of the internal clock signal 24 and an output signal 50. The output signal 50 is usually provided by an output enable buffer 52, which is used to receive the output enable signal 54 provided to the memory device (e.g., from a microprocessor or other memory control device). The output buffers 48 drive an output data bus 56.

Conventional synchronous SRAMs may also include burst control circuitry 58, which is used when burst operations are performed. During burst operations, multiple words may be read from the memory device 10, even though only a single address input is provided on the address bus 12. This is usually accomplished by providing a control signal (not shown) that indicates a burst operation is to be performed, along with the starting address for the operation. Data from that address is read out, followed by additional reads from other addresses. The information needed to generate the other addresses is provided to the row and column decoders by the burst control circuitry 58, which usually increments the starting address by some fixed value or values to generate the subsequent address information. The value(s) of the subsequent address(es) may depend on the type of burst operation being implemented, for example a linear sequential burst or an interleaved burst.

One important difference between synchronous SRAMs and asynchronous SRAMs is the use of a clock signal (Clk) to control the operations within the memory device. While the synchronous SRAM relies on such a signal, as shown in FIG. 2, the asynchronous SRAM does not. Instead, asynchronous SRAMs, such as asynchronous SRAM 100, operate independently of a system clock. Thus, address signals 102 from an address bus 102 are provided directly to row and column decoders 104 and 106. Again, the column decoders 106 may be associated with I/O circuitry (sense amplifiers and drivers, etc.) to allow for read and write operations. Thus, signals from a data bus 108 and a control bus 110 may be provided to the I/O circuits 106 to control these read and write operations. During a read, data signal from the array 112 are provided through the I/O circuitry 106 to output buffers 114, which also may be operated under the control of signals from the control bus 110, to ultimately provide data out signals 116. For a write, data signals from the data bus 108 are driven to memory cells of the array 106 specified by the address signals on address bus 102, through the I/O circuits 106.

Because the asynchronous SRAM 100 does not operate under the control of a system clock, designers must take care to ensure that any devices reading from and/or writing to the memory operate with compatible bus cycles. Further, because conventional asynchronous SRAMs typically do not operate in a burst mode, each read operation must typically be associated with a separate read address provided on address bus 102.

Synchronous and asynchronous SRAMs each have associated benefits and drawbacks, making each type of device better suited to some applications than others. For example, high performance systems that require memories to operate without skews often require the use of synchronous SRAMs. However, to date no single SRAM device (i.e., no single integrated circuit) has offered the option of choosing a synchronous or asynchronous mode of operation.

SUMMARY OF THE INVENTION

In one embodiment, a memory device (e.g., an SRAM) that is configurable to be operated in an asynchronous or a synchronous mode in accordance with a value stored in a control register thereof is provided. In addition to asynchronous and synchronous operating modes, additional features such burst mode operations, including asynchronous burst mode operations and/or synchronous burst mode operations (e.g., linear sequential and/or interleaved burst operations), are configurable in accordance with additional values stored in the control register. Also, the number of pipeline stages of an output path of the SRAM may be configured in accordance with additional values stored in the control register. 7. So too may the number of data hold cycles for synchronous operation of the SRAM be likewise configured.

In another embodiment, an SRAM that includes a control register configurable to determine an operational mode (e.g., synchronous or asynchronous operation) thereof is provided. In some cases, the control register may include storage locations for control bits to determine a type of burst mode (including linear sequential, interleaved and asynchronous burst modes); a number of output pipeline stages; and/or a number of data hold cycles for various operations of the SRAM.

Still further embodiments provide for operating a memory device (e.g., an SRAM) in a synchronous or an asynchronous mode, according to a control bit stored in a control register thereof. One of a number of available burst modes (including an asynchronous burst mode) and/or additional operating features may also be selected according to additional control bits stored in the control register.

BRIEF DESCRIPTION OF THE DRAWINGS

The present invention is illustrated by way of example, and not limitation, in the figures of the accompanying drawings in which like reference numerals refer to similar elements and in which:

FIGS. 8A–8H are timing diagrams illustrating various operational modes of a memory device configured in accordance with an embodiment of the present invention.

DETAILED DESCRIPTION

A controllable memory scheme is disclosed herein. More specifically, an SRAM that can be operated in either asynchronous or synchronous mode is described. Although discussed with reference to certain illustrated embodiments, upon review of this specification, those of ordinary skill in the art will recognize that the present scheme may find application in a variety of systems. For example, although the use of a control register is emphasized, such a register may be implemented as a number of discrete memory locations (e.g., separate one- or multiple-bit registers) or a contiguous register (e.g., a 16-bit register). Therefore, in the following description the illustrated embodiments should be regarded as exemplary only and should not be deemed to be limiting in scope.

Figure 3:
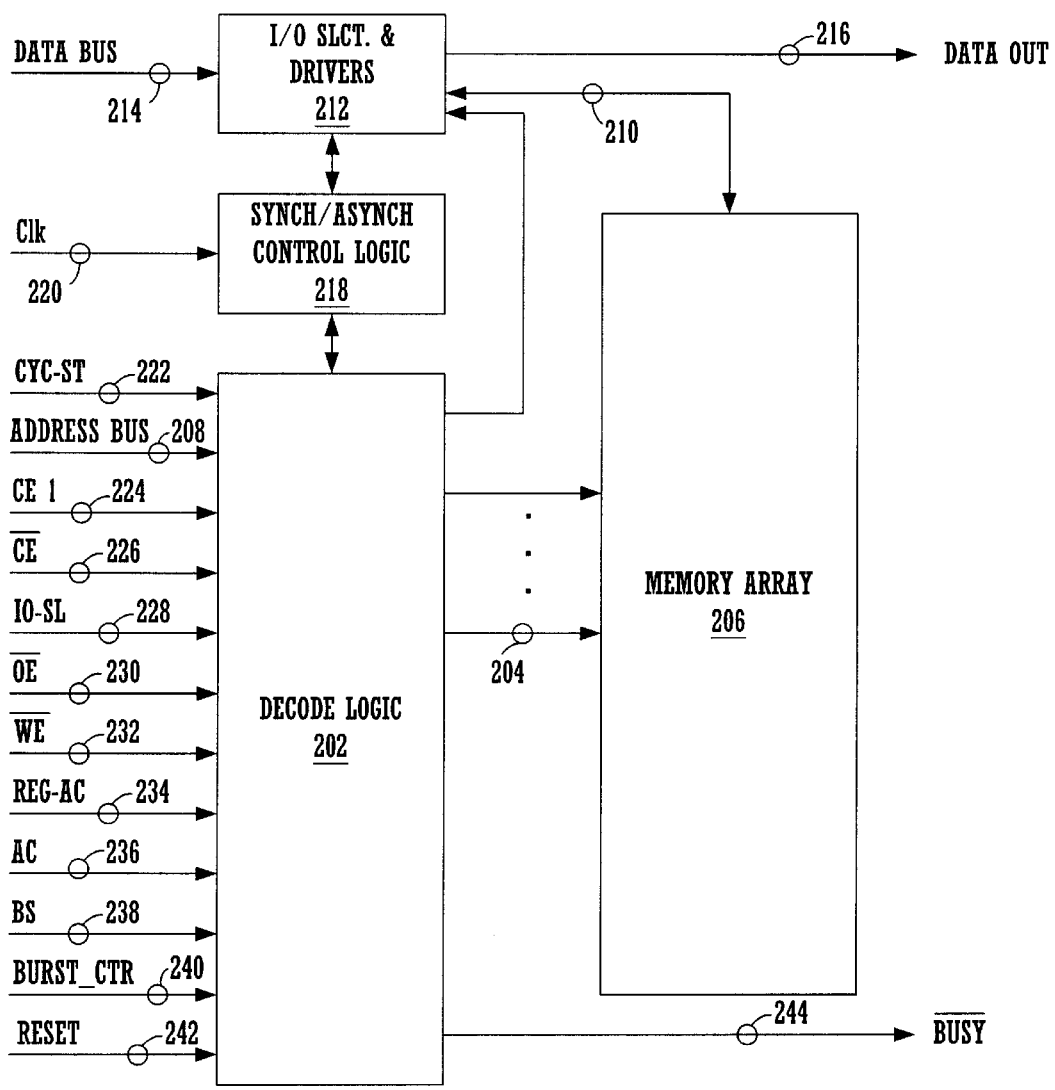
FIG. 3 illustrates an SRAM capable of being operated in asynchronous or synchronous mode, in accordance with an embodiment of the present invention.

FIG. 3 illustrates one embodiment of an SRAM 200 that may be operated in either asynchronous or synchronous mode. SRAM 200 includes decode logic 202 that provides address (row and column) signals 204 to a memory array 206 according to input signals from an address bus 208. Data signals 210 are provided to array 206 during a write operation by an I/O select and driver block 212, according to signals from a data bus 214. For a read operation, data signals from array 210 are provided to a data out bus 216 through the I/O block (e.g., which may include conventional sense amplifiers and the like) 212. A synchronous/ asynchronous control logic block 218 (which preferably includes a control register to be discussed below) controls the operation of memory device 200, including whether the device is operated in asynchronous or synchronous mode.

In addition to the address and data signals, 208 and 214, various other input signals are used in the operation of memory device 200, depending upon whether the device is operated as a synchronous or asynchronous SRAM. Note, in addition to those control signals illustrated, other conventional memory control signals may be needed, but are not illustrated so as not to unnecessarily clutter the illustration. For example, when operated as a synchronous SRAM, a clock signal 220 is provided to memory device 200. This clock signal 220 is not necessary when memory device 200 is operated in asynchronous mode.

Other input and/or control signals include a cycle start input signal 222 (Cyc_St), which operates as an address enable input as found on conventional SRAMs. One or more chip select signals, CEE1 224 and/or /CE 226, may be used, CE1 being an active logic high chip select and /CE being an active logic low chip select. Signal IO-SL 228 is an I/O select signal which may be used to control whether memory device 200 is operated in a ×8 or ×16 mode (i.e., it is intended that, memory device 200 should be able to operate with an 8-bit or 16-bit (or, more generally, N-bit or 2N-bit wide) data bus). When operated in ×8 mode, a high order address bit (Ac) 236 is provided, while a byte select signal (BS [0:1]) 238 is used for ×16 mode. An output enable signal (/OE) 230 is provided as is the case with conventional memory devices, and so too is a conventional write control signal (/WE) 232. A /Busy signal 244 (active low) indicates that an active access to memory array 206 is in progress.

Signals unique to memory device 200 include a register access signal (Reg-Ac) 234. This signal is used to select the control register (discussed in detail below) that allows a user to program the operating mode of memory device 200. In other embodiments, this input may be replaced by a conventional JTAG input port, where access to the control register is provided through such an interface. A Reset signal 242 allows the user to reset the control register to its default values (see below).

Another input signal unique to memory device 200 is a burst control (Burst_Ctr) signal 243. This signal (in combination with a control register setting) allows for burst mode operation even when memory device 200 is operating in asynchronous mode. The ability to perform burst transfers in asynchronous mode provides additional flexibility for the present memory device.

Figure 4:
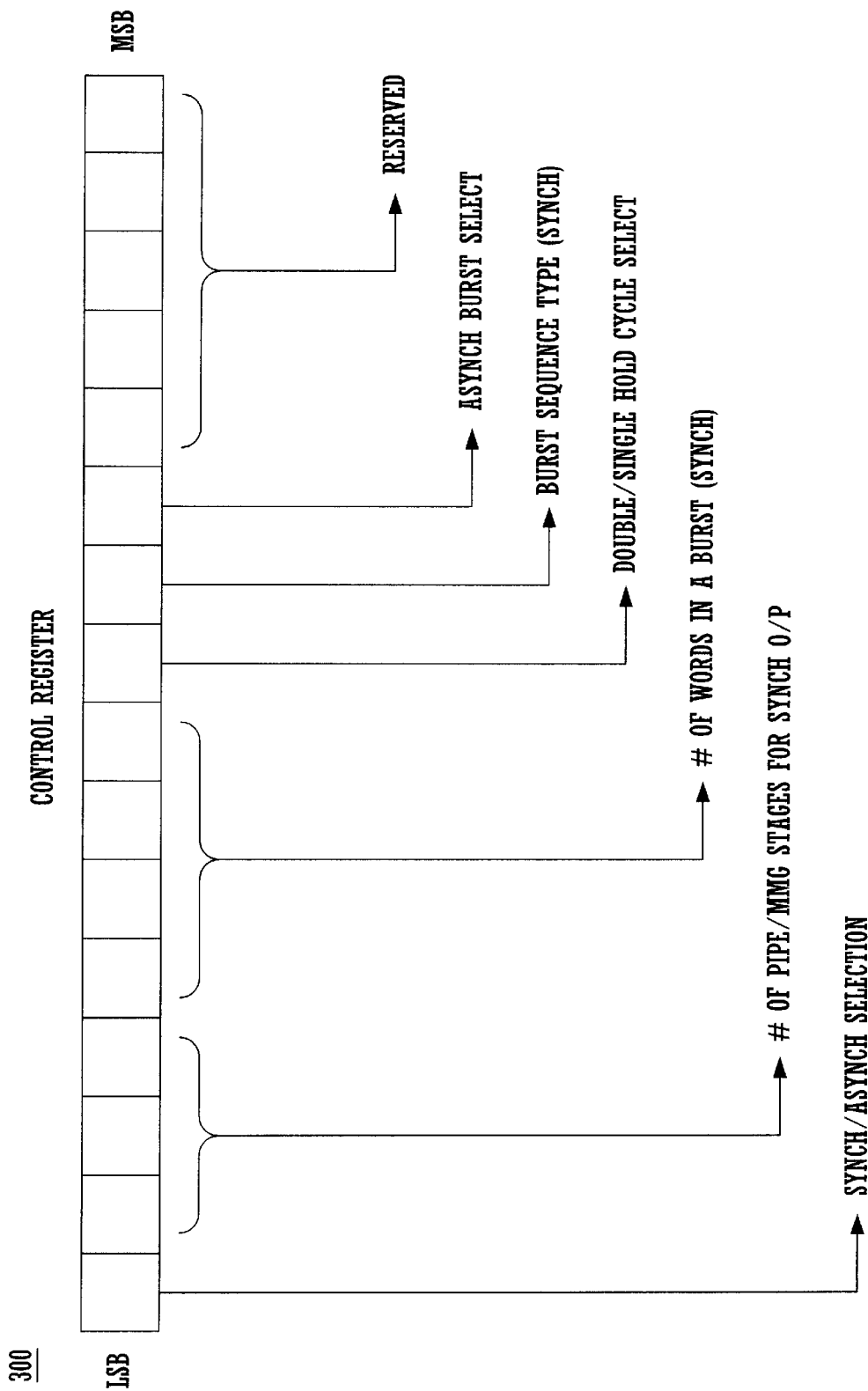
FIG. 4 illustrates one example of a control register for use in controlling features of the SRAM shown in FIG. 3, in accordance with an embodiment of the present invention.

As indicated above, the operational mode of memory device 200 may be set by a user through the programming of a control register (e.g., which may be associated with the control logic block 218. FIG. 4 illustrates one example of such a control register 300. Control register 300 may be physically implemented as a conventional 16-bit register (or other size register in other embodiments). In some cases, control register 300 may even be a reserved portion of memory array 206, in which case a special address associated with the register may be used to access it. Thus, in these cases a separate Reg-Ac signal may not be required. Also, the register 300 may be a register accessible through a conventional JTAG interface, in which case a dedicated input sequence may be used to access it. For the general case, however, register 300 may be regarded as a separate control register that is accesses through control of the Reg-Ac signal 234 as noted above. During such accesses, data may be written to register 300 using data bus 214.

Figure 1:
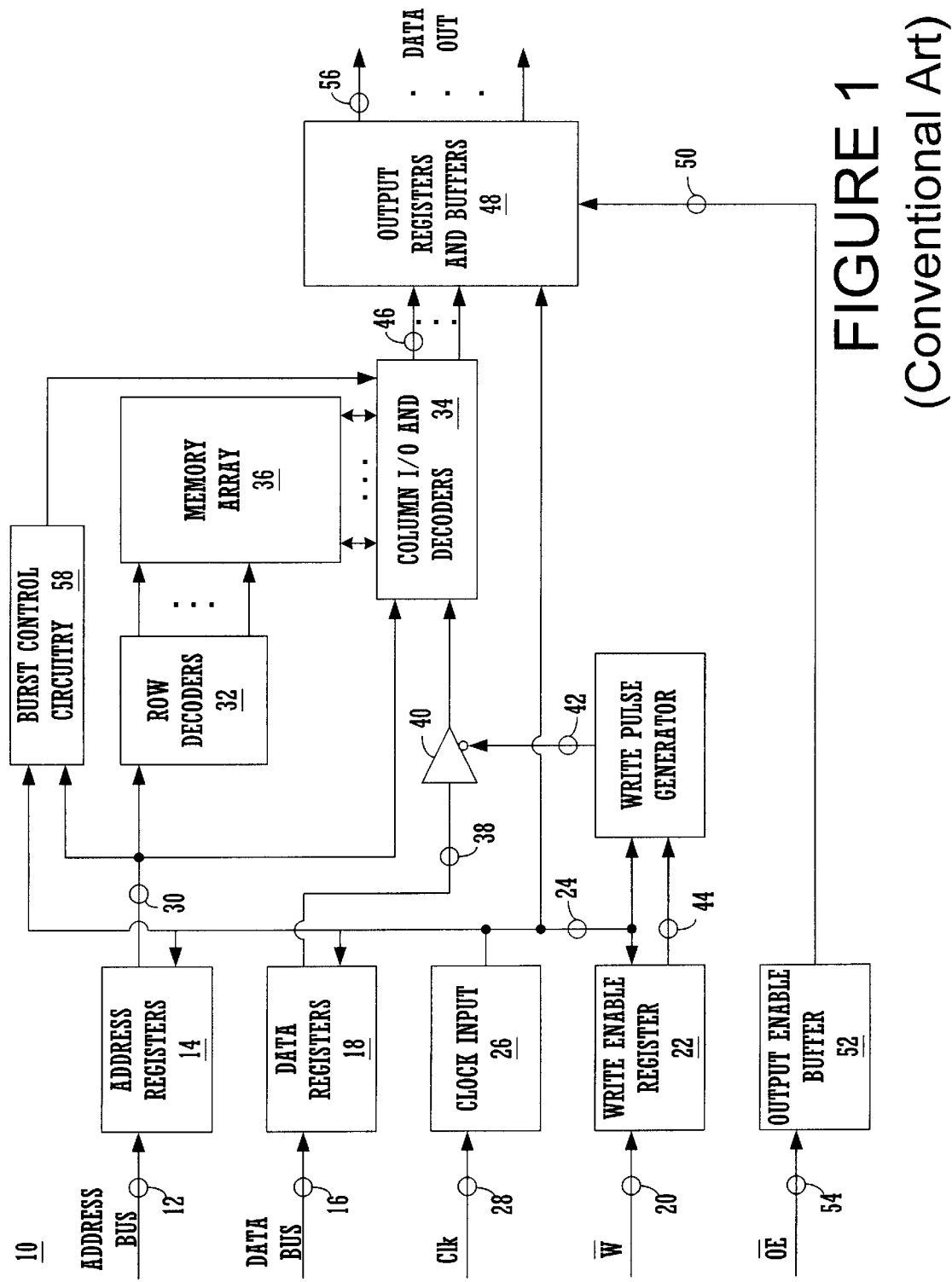
FIG. 1 illustrates features of a conventional synchronous SRAM.
Figure 2:
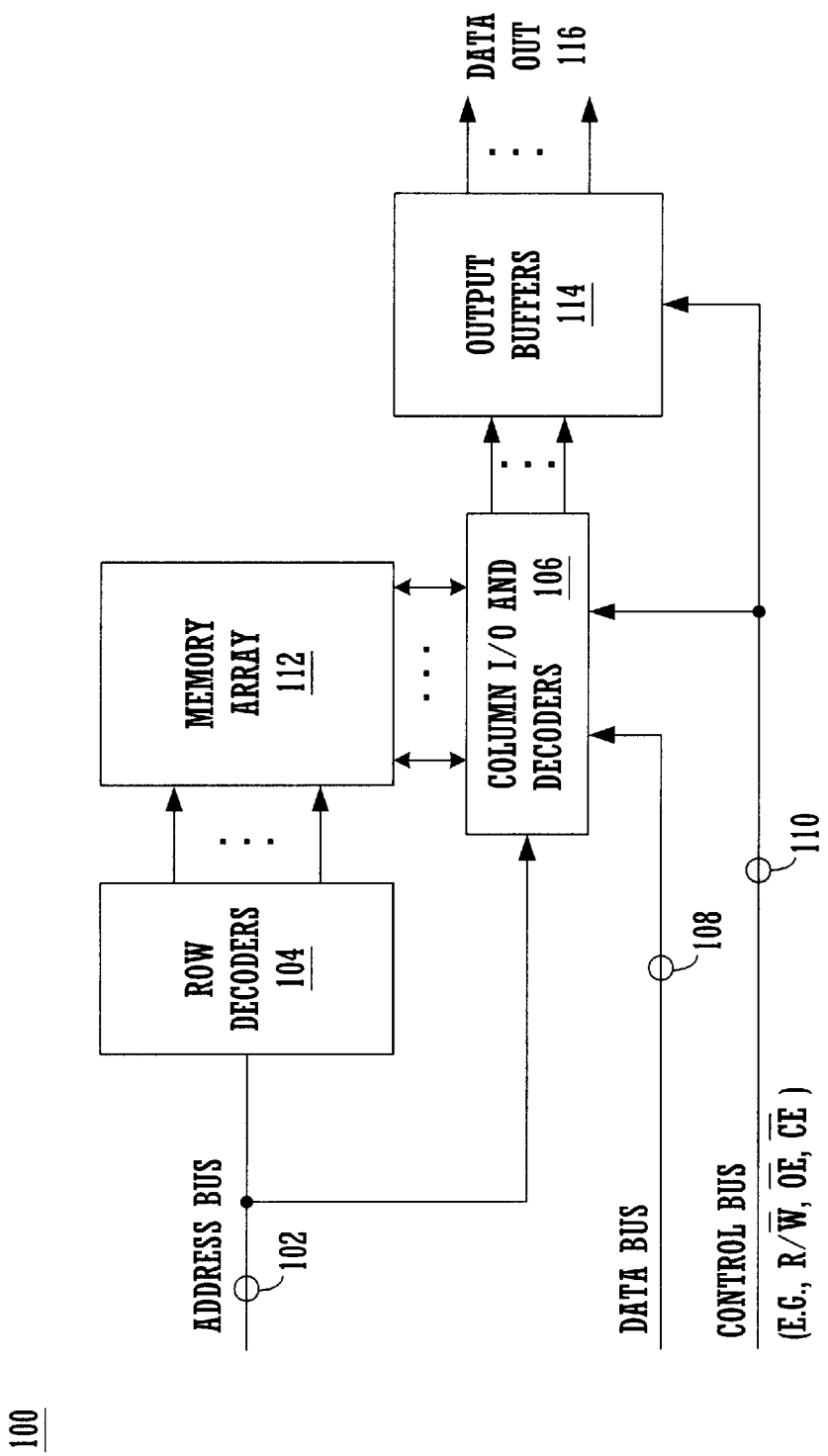
FIG. 2 illustrates features of a conventional asynchronous SRAM.

When operated as a synchronous SRAM, memory device 200 may logically resemble the synchronous SRAM 10 illustrated in FIG. 1. That is, all of the conventional logic blocks and elements associated with a synchronous SRAM will be available. Further, when operated as an asynchronous SRAM, memory device 200 will logically resemble the asynchronous SRAM illustrated in FIG. 2. Again, in this mode all of the features of a conventional asynchronous SRAM will be available.

In addition to having the features of a conventional SRAM (whether asynchronous or synchronous), memory device 200 will have additional features that are not always available with conventional memories. For example, memory device 200 may have a user programmable number of output pipeline stages. This may be implemented by allowing control of the number of output registers in a chain in an output register block similar to output register/buffer 48 shown in FIG. 1. Also, memory device 200 may utilize burst control circuitry that allows for burst access operation even in asynchronous mode, a feature not commonly found on asynchronous SRAMs. Other user-programmable features of memory device 200 are explored below.

The value loaded in control register 300 will determine the operational mode of memory device 200. Accordingly, certain bits of control register 300 are associated with certain operational features of memory device 200. For example, one bit (e.g., the least significant bit) of control register 300 may determine whether memory device 200 is operated in synchronous or asynchronous mode. Where memory device 200 is operated as a synchronous SRAM, several other features are available. For example, through programming of register 300, a user can control the number of pipeline states for an output path of the memory device. That is, the number of output stages in a set of output registers can be set through user programming. This is useful where the operation of memory device 200 needs to be matched to a certain processor or memory control device.

In addition, the number of words in a burst operation as well as the type of burst access (e.g., linear sequential or interleaved) can be set through appropriate programming of control register 300. By allowing multiple bit control over the number of words to be provided as part of a burst operation, memory device 200 provides additional flexibility for use in a variety of applications. Physical implementation of this feature may be accommodated by providing a counter (used as part of a burst control circuit in conventional synchronous SRAMs) with a variable size (e.g., 2-bit, 4-bit, 8-bit, etc.). The specific size could be selected in accordance with the control register setting for the number of words in a burst, thus allowing for multiple combinations thereof.

In addition, register 300 may allow for user control over whether memory device 200 operates with a single cycle data hold or double cycle data hold on read accesses in synchronous mode. For single cycle data holds, after a read cycle, the data on output bus 216 will be invalid one cycle after the chip is deselected (using CEI 224 and /CE 226). For double cycle deselect data holds, during a read operation data will be invalid two cycles after the chip is deselected.

Figure 5:
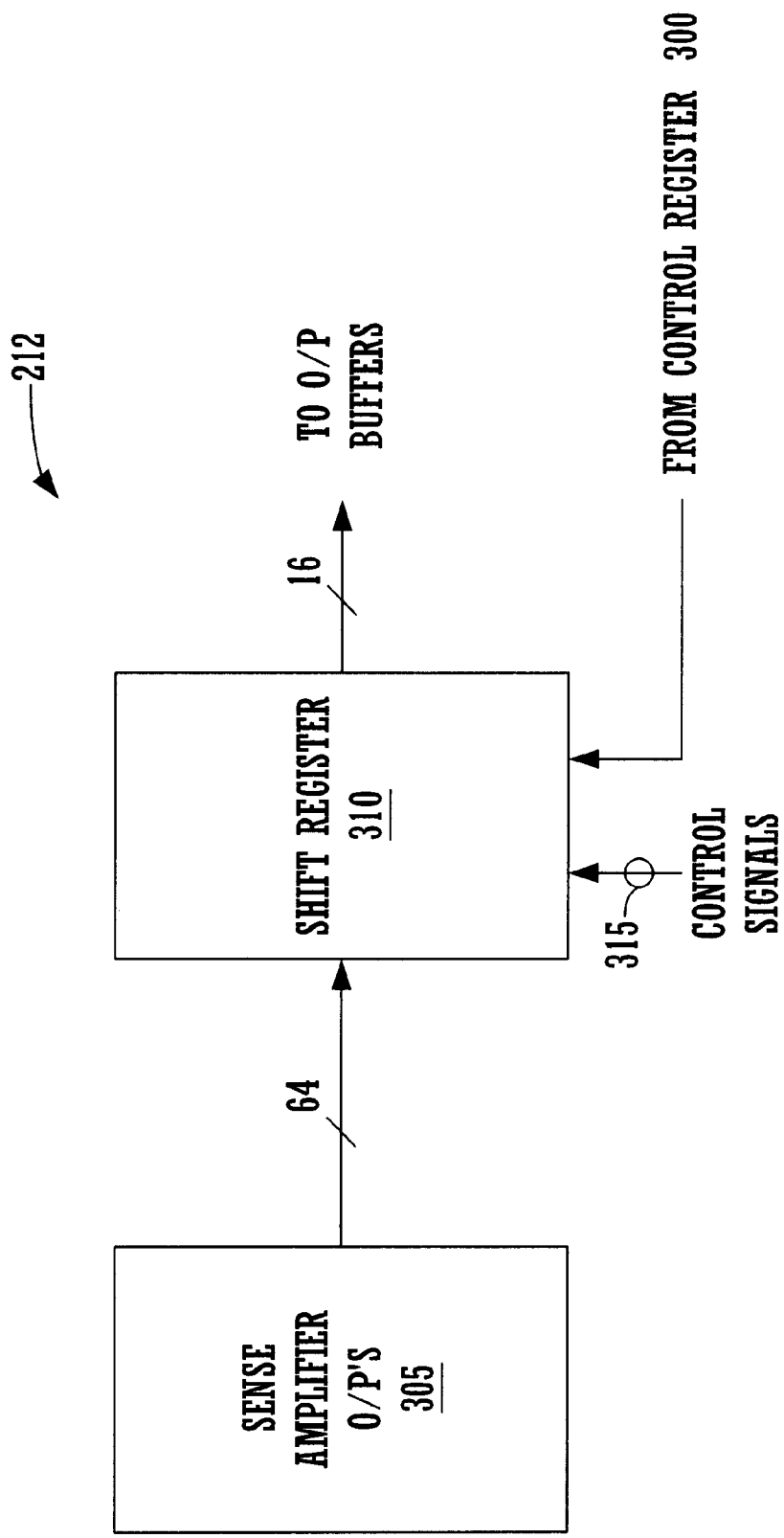
FIG. 5 illustrates the use of a shift register to allow for burst access to the memory device shown in FIG. 3 when operated in asynchronous mode, in accordance with an embodiment of the present invention.
Figure 6:
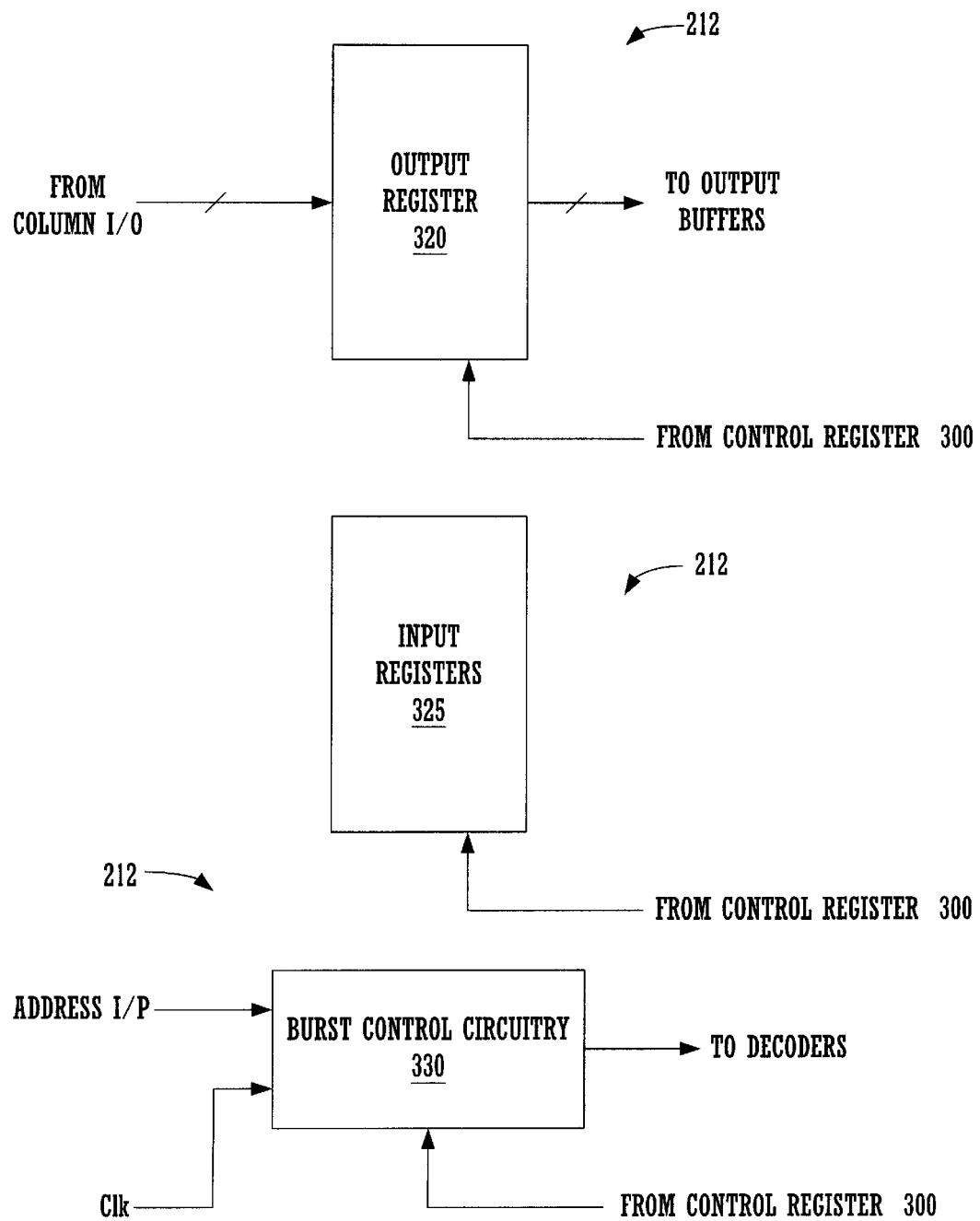
FIG. 6 illustrates register control for input, output and burst control circuitry for the memory device shown in FIG. 3 when operated in synchronous mode in accordance with an embodiment of the present invention.

As indicated above, memory device 200 may allow for burst operations even when operated as an asynchronous SRAM. Control of this feature is provided through control register 300. As illustrated in FIG. 5, this may be physically implemented (in one example) by allowing the output of sense amplifies 305 of I/O stage 212 to pass through a shift register 310. Shift register 310 may be a 4-word shift register, each word of which receives 16-bits of the 64-bit output provided by the sense amplifiers 305. Operating under the control of control register 300 and additional control signals 315 derived from the burst control signal 240, one of the outputs of the shift register 310 can be selected and passed on to the output buffers of the I/O stage 212. By toggling the control signals 315, different 16-bit words stored in the shift register (e.g., up to a maximum of four words for one embodiment) can be read out from a single access to memory array 206. Where no burst operation is selected, this feature is disabled.

Each bit of the control register 300 may be set to a logic high (1) or logic low (0) value. In one embodiment, the logic low value (0) is the default value for each bit. In such an embodiment, when the synchronous/asynchronous selection bit has a value of 0, asynchronous operation may be selected. Thus, a value of 1 for this bit will indicate synchronous operation is selected. When synchronous operation is selected, control register 300 provides enable signals to output registers 320, input registers 325 and burst control circuitry 330, each of which may be part of the I/O circuit block 212. The input and output registers 325 and 320, as well as the burst control circuitry 330, may be conventional in nature, with the exception that the size of the counter for the burst control circuit 330 is variable, as described herein.

Figure 7:
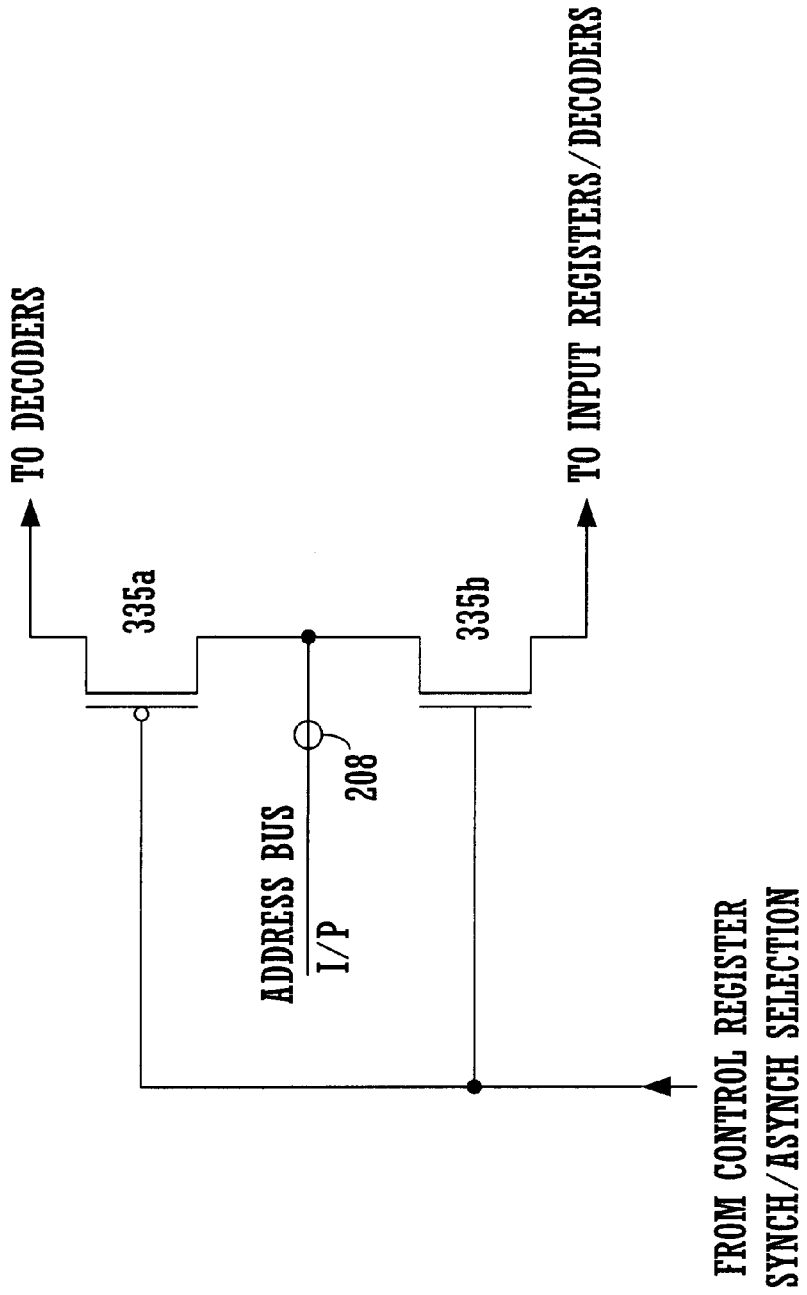
FIG. 7 illustrates one example of the use of passgate control logic to allow for synchronous or asynchronous operation of the memory device shown in FIG. 3 in accordance with an embodiment of the present invention.

One example of how the output of the control register 300 may be used to enable or disable such circuitry in memory device 200 is shown in FIG. 7. In this example, two passgates 335a and 335b are operated under the control of an output signal from control register 300. Assuming these passgates are placed in the input path of the address signals fromaddress bus 208, when operated in synchronous mode passgate 335b will be active, allowing the input address signals to be passed to input address registers (not shown). When operated as an asynchronous part, passgate 335a will be active, allowing the input address signals to be passed directly to row and column decoders (which may be conventional in nature). In each case, a single control bit of control register 300 may be used to select the appropriate input path, thus allowing for control over the operating mode of the memory device 200. Similar passgate or other control logic arrangements well within the knowledge and capability of one of ordinary skill in the art may be used for the other operational control features described herein.

The number of pipeline stages for the output path in the synchronous mode may be set with a three-bit combination. A single wait state may be indicated by the value 000, two wait states by the value 001, and so on. The upper limit on this value may be determined by the number of bits made available for this function and/or the number of available physical pipeline stages.

The number of data words to be included in a synchronous burst operation may be set by a four-bit value. Here, a value of 0000 may indicate a 4-word burst, 0001 may indicate an 8-word burst, an so on. The number of words to be included in a burst may be limited by the physical size of the counter available in the burst control logic and/or the number of bits of the control register 300 devoted to this function.

Single bits of control register 300 may be used for selecting double or single hold cycle operation (e.g., single cycle=0, double cycle=1); the burst sequence type (e.g., linear=0, interleaved=1); and whether or not to use allow burst operations in the asynchronous mode (e.g., no burst=0, burst permitted=1). Further bits of control register 300 (e.g., 5 bits for a 16-bit control register) may be reserved for further use.

Figure 8A:
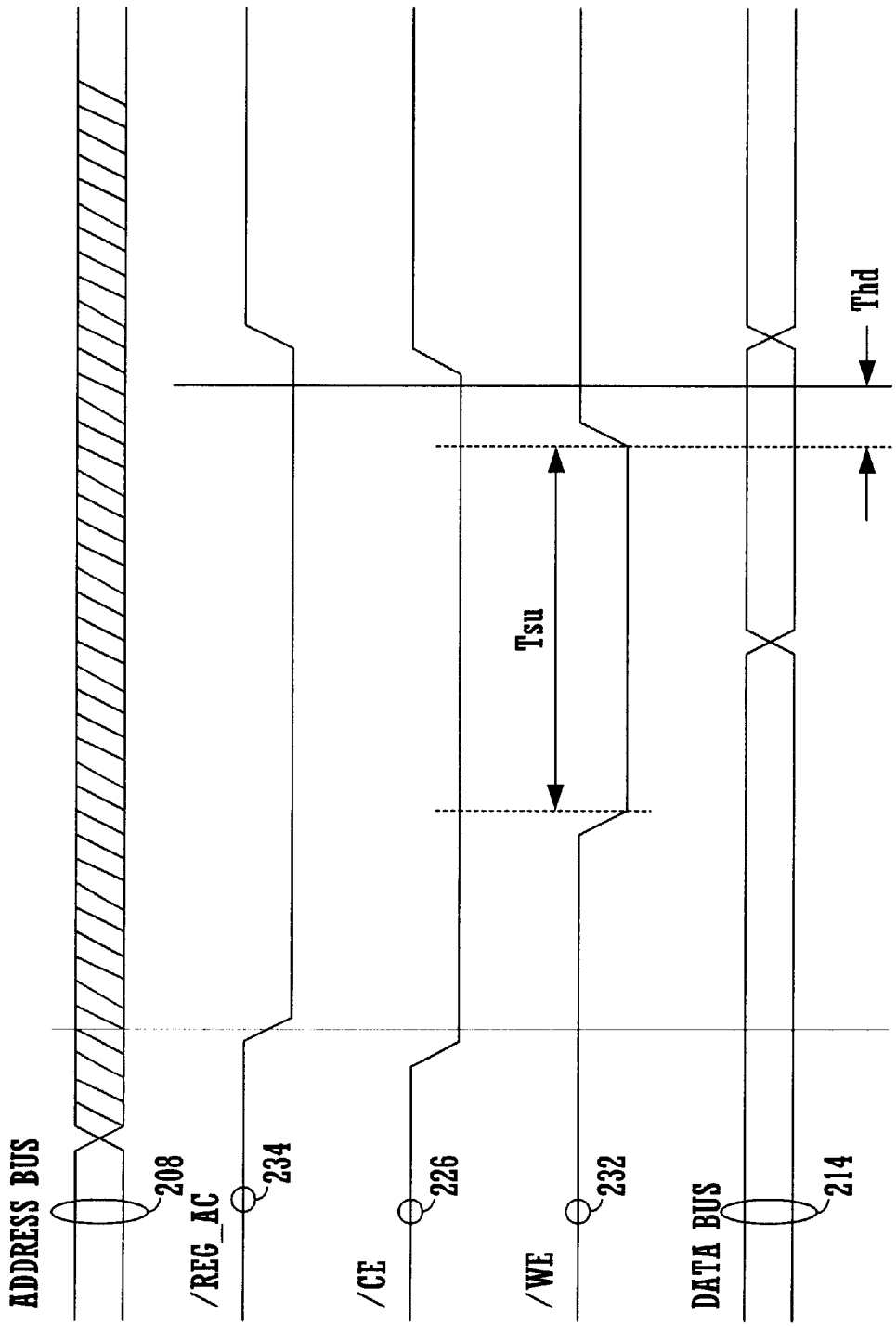

The various operational modes of memory device 200 can be best illustrated through the use of the timing diagrams presented in FIGS. 8A–8H. Assuming that the memory device 200 powers up initially so that the control register is set to its default value (i.e., all 0s), the memory device will operate initially in asynchronous mode. To write to control register 300 in such a case, a conventional asynchronous write cycle may be used, provided that the register access signal (Reg-Ac) is pulled low (i.e., to the active state). This asynchronous register write operation is illustrated in FIG. 8A. During this sequence, the value of the address bus 208 is ignored and the chip enable and write enable signals, 226 and 232, are brought active (just as is the case for a conventional asynchronous write). The value of the data bus 214 is latched into control register 300 on the rising edge of write enable signal 232. A set up margin Tsu and hold margin Thd should be observed to ensure that the correct value of the data bus 214 is read.

Figure 8B:
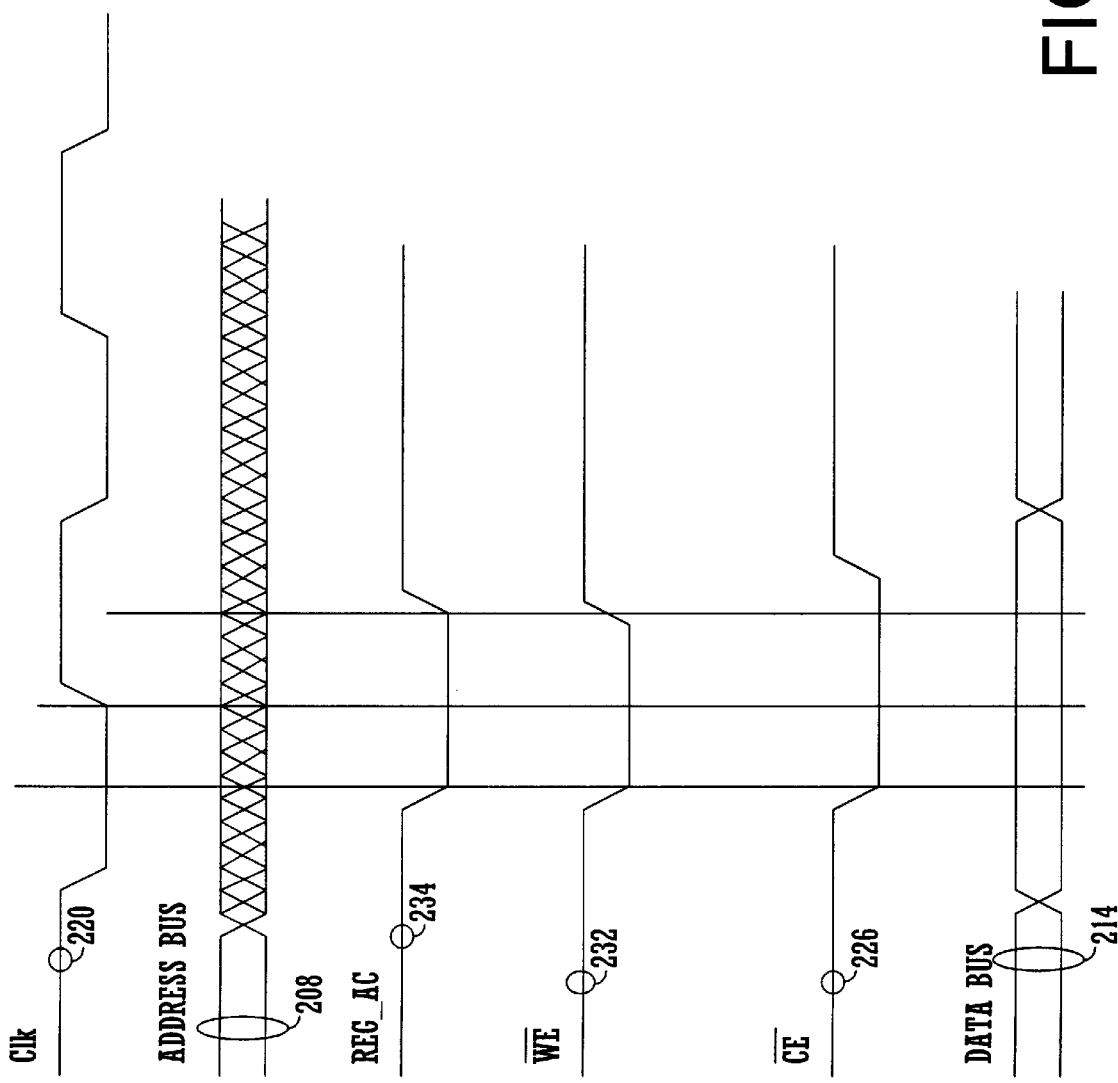
Figure 8C:
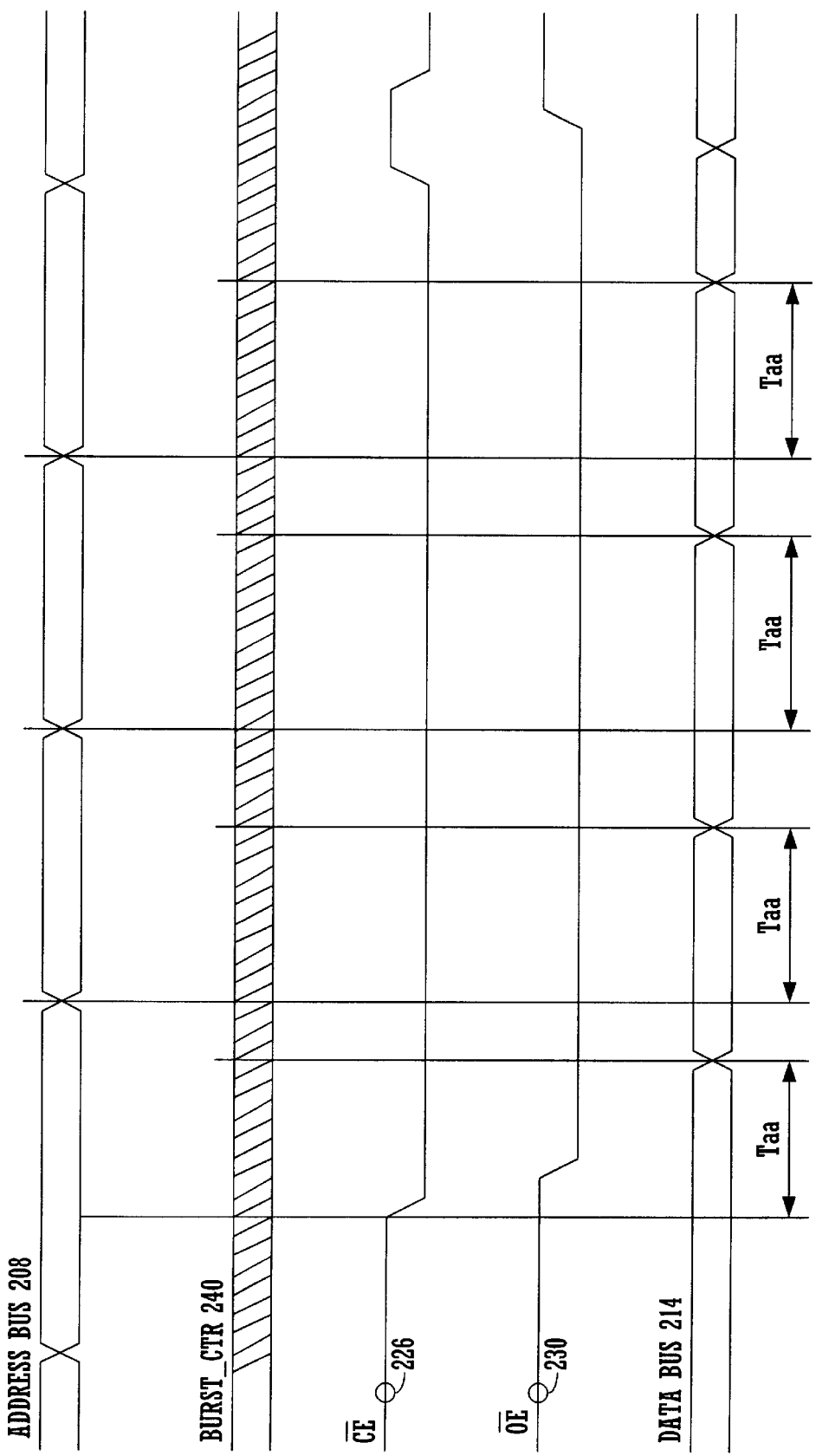

If during synchronous mode operation the value of control register 300 needs to be altered, a synchronous write may be used as shown in FIG. 8B. Here, the register access signal 234, write enable signal 232 and chip enable signal 226 are all brought low (active) and the value of the data bus is latched in the control register 300 on the rising edge of either the write enable signal 232 or register access signal 234. To reset the control register to its default value, the reset signal 242 may be brought active (e.g., low) for two successive clock cycles while in synchronous mode. For asynchronous mode, the reset signal 242 and the chip enable signal 226 should be brought low (active) together.

Figure 8D:
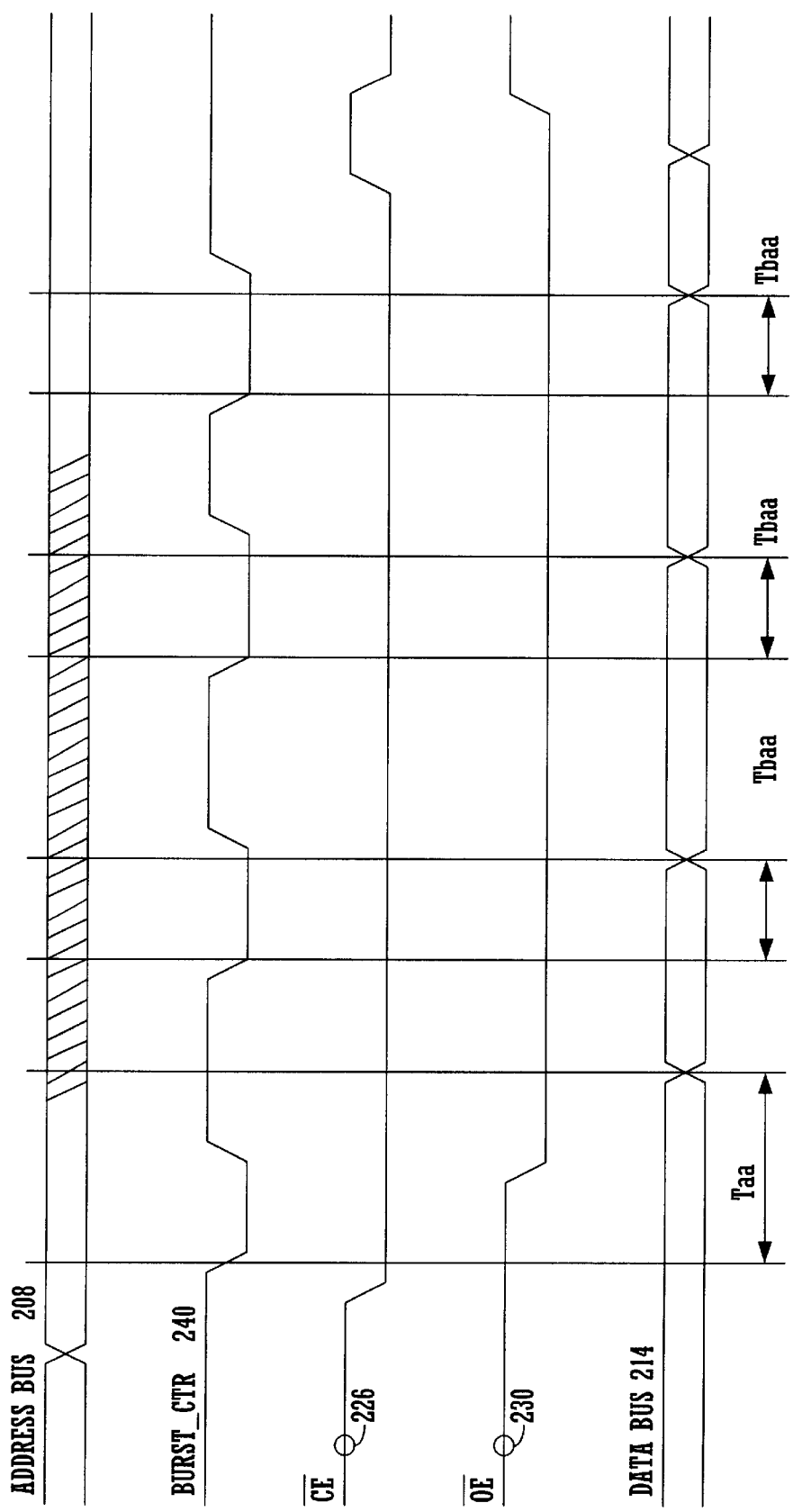

Asynchronous operations of memory device 200 are illustrated in FIGS. 8C–8F. First, in FIG. 8C, asynchronous read operations are shown. This is a conventional asynchronous read for an SRAM, with access time Taa. An asynchronous burst mode read is illustrated in FIG. 8D. Here, the asynchronous burst access bit of control register will need to be set to 1 (e.g., in a prior configuration write step) and then the read sequence shown in the illustration can be used. In this case, the burst control signal 240 is toggled to step through the values stored in the shift register 310. The initial read requires an access time Taa, however, subsequent reads require an access time Tbaa. During the burst read, the output enable and chip enable signals 230 and 226 may be held active and only the initial address value need be presented. The subsequent three reads will be from the subsequent three address locations, which values are latched in the shift register 310 at the time of the first read.

Figure 8E:
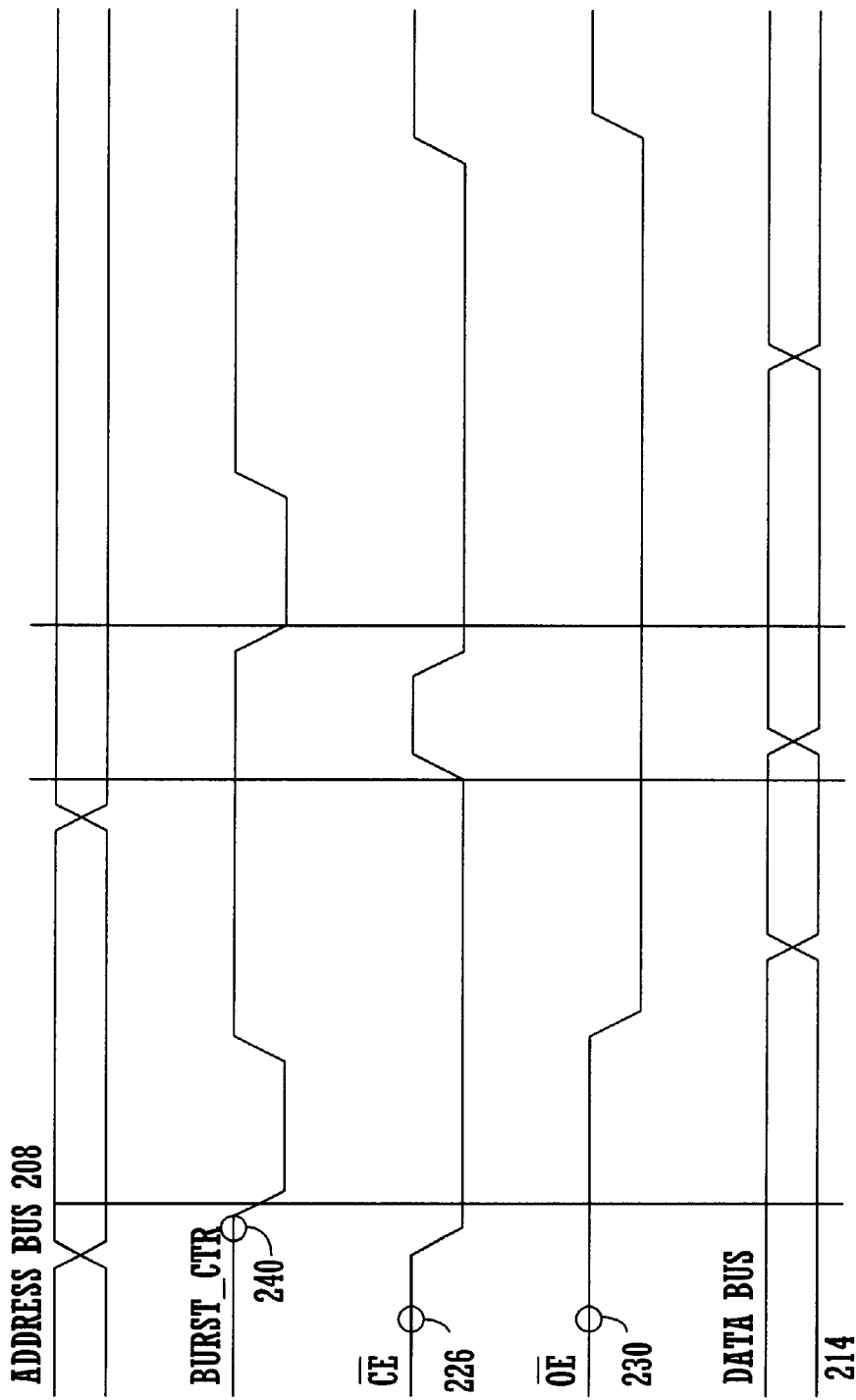

If the memory device 200 is set to operate in asynchronous burst mode, but a user wishes to read from only a single memory address in a read operation, the memory device should be deselected between reads, as shown in FIG. 8E. That is, between reads, the chip enable signal 226 should be brought to a logic high to deselect the memory device, allowing a new read from a single address location to be performed.

Figure 8F:
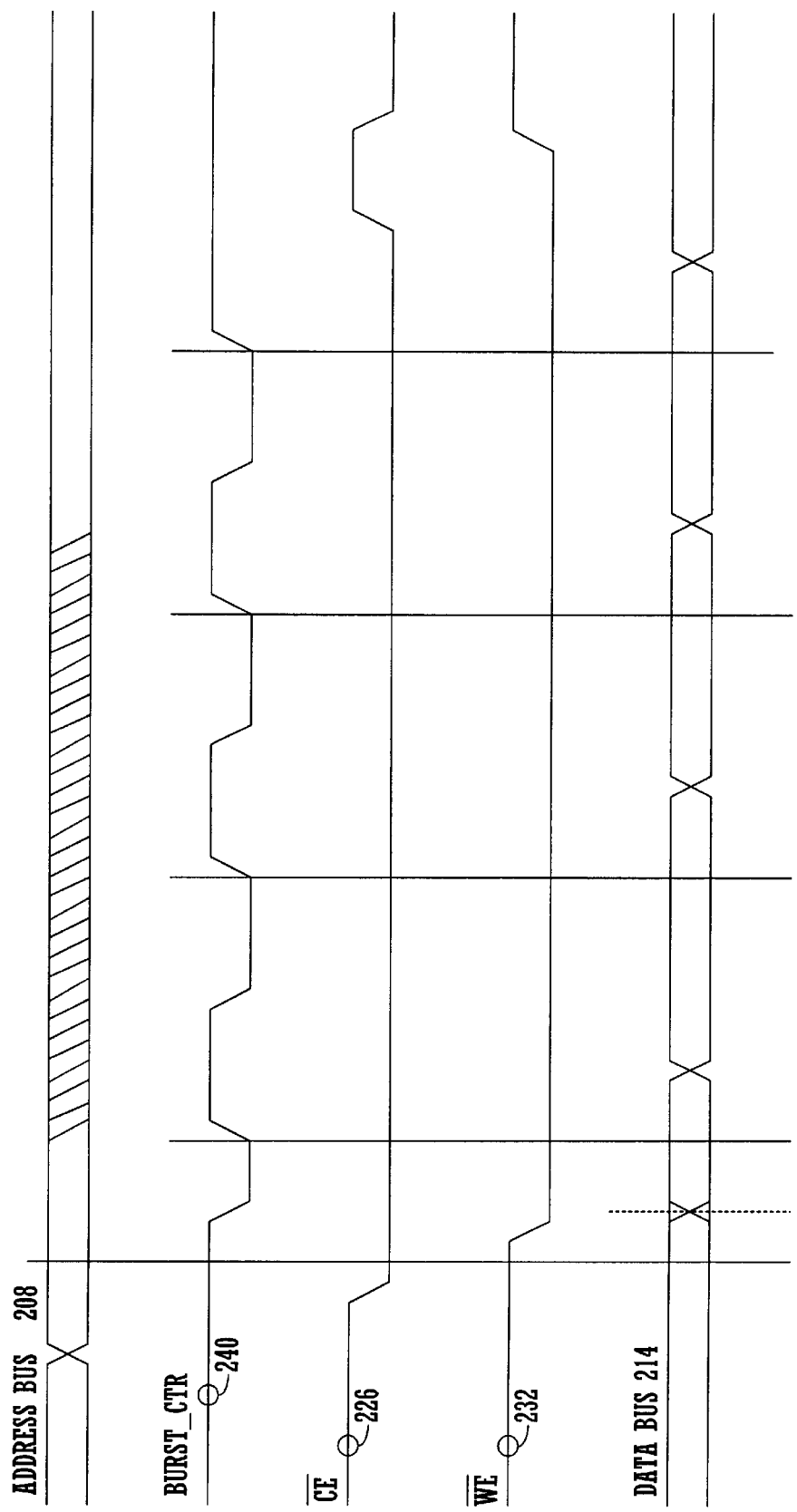

FIG. 8F illustrates a write operation for memory device 200 when operated in the asynchronous burst mode. Here, the initial address is presented on address bus 208 and subsequent data values are stored at the initial and subsequent three addresses by toggling the burst control signal 240. For single mode (i.e., non-burst) asynchronous operation, the write resembles a conventional write operation for an asynchronous SRAM.

FIGS. 8G and 8H illustrate synchronous mode operations for memory device 200. In this example, synchronous mode accesses are aligned to the rising edge of the clock signal. First, FIG. 8G shows the timing for a synchronous mode burst read access. All synchronous reads have the option to offset the first data output by a variable number of cycles, as determined by the bit pattern for the number of output pipeline stages loaded in control register 300. Thus, in the illustration, the wavy line is meant to indicate a variable number of cycles before the first data output. In addition, the burst output may be linear sequential or interleaved, again as determined by the programming of control register 300. Also, the number of data words output is under user control. As shown in the illustration, the burst output is operated under the control of the burst control signal 240 and successive data words are output on the rising edge of that signal.

A synchronous burst mode write access is shown in FIG. 8F. This resembles a conventional synchronous write to an SRAM, with the burst control signal 240 being used to provide windows for the valid data to be latched out. All other synchronous mode operations are conventional in nature.

Thus a controllable memory scheme has been described. Although the foregoing description and accompanying figures discuss and illustrate specific embodiments, it should be appreciated that the present invention is to be measured only in terms of the claims that follow.

What is claimed is:

1. A memory device having a memory array configurable to be operated between asynchronous and synchronous modes in accordance with a value stored in a control register coupled to said memory device and to be operated in burst modes in accordance with additional values stored in said control register, wherein said burst modes include an asynchronous burst mode.

2. The memory device of claim 1 wherein the memory device comprises a static random access memory (SRAM).

3. The memory device of claim 2 wherein said memory array is further configurable to be operated in synchronous burst mode in accordance with additional values stored in said control register.

4. The memory device of claim 2 wherein said memory array is further configurable to be operated with a number of pipeline stages of an output path in accordance with additional values stored in said control register.

5. The memory device of claim 2 wherein said memory array is further configurable to be operated with a number of data hold cycles in accordance with additional values stored in said control register.

6. The memory device of claim 3 wherein the synchronous burst mode operations include a burst sequence type and a number of words accessed during a burst operation.

7. A static random access memory (SRAM) comprising:
  a) a memory array; and
  b) a control register configurable to determine an operational mode of said memory array accord king to bits in said control register, wherein said memory array is operable between synchronous and asynchronous modes according to one of said bits in said control register and said bits in said control register determine types of burst modes for the memory array, wherein said burst modes include an asynchronous burst mode.

8. The SRAM of claim 7 wherein the types of burst modes further include linear sequential and interleaved burst mode operation.

9. The SRAM of claim 7 wherein the control register further comprises storage locations for control bits to determine a number of pipeline stages for synchronous outputs of the memory array.

10. The SRAM of claim 7 wherein the control register further comprises storage locations for control bits to determine a number of data hold cycles for synchronous read operations of the memory array.

11. The SRAM of claim 7 being further configurable to operate with an N-bit or 2N-bit wide data bus.

12. A method, comprising operating a memory array of a memory device between synchronous and asynchronous modes and in one of a number of available burst modes according to control bits stored in a control of the memory device, wherein said burst modes include an asynchronous burst mode.

13. The method of claim 12 wherein the memory device comprises a static random access memory (SRAM).

14. The method of claim 12 further comprising operating the memory array to have a selected number of output pipeline stages according to further control bits stored in the control register.

* * * * *